United States Patent
Honma

(10) Patent No.: US 9,039,837 B2
(45) Date of Patent: May 26, 2015

(54) FILM DEPOSITION APPARATUS AND SUBSTRATE PROCESSING APPARATUS

(75) Inventor: Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 574 days.

(21) Appl. No.: 13/550,902

(22) Filed: Jul. 17, 2012

(65) Prior Publication Data

US 2013/0019801 A1    Jan. 24, 2013

(30) Foreign Application Priority Data

Jul. 21, 2011   (JP) ................................ 2011-160211

(51) Int. Cl.
| | |
|---|---|
| *C23C 16/00* | (2006.01) |
| *C23C 16/40* | (2006.01) |
| *C23C 16/44* | (2006.01) |
| *C23C 16/455* | (2006.01) |

(52) U.S. Cl.
CPC ........... *C23C 16/402* (2013.01); *C23C 16/4412* (2013.01); *C23C 16/45548* (2013.01)

(58) Field of Classification Search
CPC ...................... C23C 16/45548; C23C 16/4412
USPC ......................................................... 118/719
See application file for complete search history.

(56) References Cited

U.S. PATENT DOCUMENTS

| | | |
|---|---|---|
| 6,869,641 B2 | 3/2005 | Schmitt |
| 7,153,542 B2 | 12/2006 | Nguyen et al. |
| 2010/0055297 A1 | 3/2010 | Kato et al. |

FOREIGN PATENT DOCUMENTS

| | | |
|---|---|---|
| CN | 101660140 A | 3/2010 |
| JP | 3144664 | 3/2001 |
| JP | 2007-247066 | 9/2007 |

*Primary Examiner* — Keath Chen
(74) *Attorney, Agent, or Firm* — IPUSA, PLLC

(57) ABSTRACT

A film deposition apparatus includes a processing chamber; a rotary table; process regions provided in the processing chamber and arranged apart from each other in the rotational direction of the rotary table; reaction gas supplying units configured to supply reaction gases of different types to the corresponding process regions; separation regions provided between the process regions; separation gas supplying units configured to supply a separation gas to the separation regions to separate the atmospheres of the process regions; and an exhaust path forming part having openings at positions corresponding to the process regions and configured to form exhaust paths for separately guiding the atmospheres of the process regions from the openings to the corresponding exhaust ports of the processing chamber for exhausting atmospheres of the process regions. The exhaust path forming part is configured such that positions of the openings in the rotational direction are changeable.

7 Claims, 14 Drawing Sheets

FILM DEPOSITION APPARATUS AND SUBSTRATE PROCESSING APPARATUS

CROSS-REFERENCE TO RELATED APPLICATION

The present application is based upon and claims the benefit of priority of Japanese Patent Application No. 2011-160211, filed on Jul. 21, 2011, the entire contents of which are incorporated herein by reference.

BACKGROUND OF THE INVENTION

1. Field of the Invention

A certain aspect of this disclosure relates to a film deposition apparatus and a substrate processing apparatus.

2. Description of the Related Art

In a known method or process for depositing (or forming) a film in a semiconductor manufacturing process, a first reaction gas is caused to be adsorbed on the surface of a substrate such as a semiconductor wafer (hereafter simply referred to as "wafer") in a vacuum atmosphere, and then a second reaction gas is supplied instead of the first reaction gas to cause reaction between the first and second reaction gases, and thereby form one or more atomic or molecular layers. This cycle is repeated multiple times to stack the layers and thereby form a film on the substrate. This method or process is called atomic layer deposition (ALD) or molecular layer deposition (MLD). For example, U.S. Pat. No. 7,153,542, Japanese Patent No. 3144664, U.S. Pat. No. 6,869,641, and Japanese Laid-Open Patent Publication No. 2007247066 disclose apparatuses that perform a film deposition process as described above.

Such a film deposition process is preferably used, for example, to form a high-dielectric film used as a gate oxide. For example, when forming a silicon dioxide film ($SiO^2$), bis-(tertiary butyl amino)-silane (BTBAS) may be used as the first reaction gas (source gas) and ozone gas may be used as the second reaction gas (oxidizing gas).

In a proposed film deposition apparatus, a film deposition process (or film forming process) is performed on multiple substrates that are arranged on a rotary table, which is provided in a vacuum chamber, in the rotational direction of the rotary table. The proposed film deposition apparatus includes multiple process regions arranged apart from each other in the rotational direction of the rotary table in the vacuum chamber. Different reaction gases are supplied into the process regions, and a film deposition process is performed in the process regions. Separation regions are provided between the process regions arranged in the rotational direction. Separation gas supplying units are provided to supply a separation gas into the separation regions and to thereby separate the atmospheres of the process regions.

During a film deposition process, the separation gas is supplied from the separation gas supplying units. The separation gas spreads on the rotary table in forward and backward rotational directions, and forms separation spaces at the separation regions to prevent the reaction gases from mixing. The reaction gases supplied into the process regions are exhausted from exhaust ports provided in the vacuum chamber together with the spread separation gas. While supplying the reaction gases to the process regions and supplying the separation gas to the separation regions, the rotary table is rotated to repeatedly move the substrates between process regions forward and backward and thereby perform ALD or MLD.

The appropriate size of the separation regions vary depending on the process conditions such as the types of gases used. For example, for a process where a relatively long time is necessary for adsorption of molecules in reaction gases, the size of the separation regions is preferably made smaller than that for a process where a relatively short time is necessary for adsorption of molecules in reaction gases. Also, for a process where a relatively long time is necessary for oxidation, it is preferable to set the length in the rotational direction between a region where an oxidation gas is supplied and a separation region. Also, process regions may be provided to cause three or more gases to react with each other on a wafer, and separation regions may be provided between the process regions. Thus, an appropriate arrangement of process regions and separation regions may vary depending on the process to be performed.

Here, when reaction gases supplied to different process regions mix and react with each other, particles are generated. To prevent the mixture of reaction gases, a film deposition apparatus is preferably configured to control the directions of exhaust flows. Also, exhaust flows in a vacuum chamber need to be changed according to the number of process regions and the arrangement of separation regions. However, it is troublesome to form exhaust ports in a vacuum chamber each time when a different process is performed. The patent documents mentioned above do not point out this problem and do not provide any solution for this problem.

SUMMARY OF THE INVENTION

In an aspect of this disclosure, there is provided a film deposition apparatus for forming a film on a substrate. The film deposition apparatus includes a processing chamber; a rotary table disposed in the processing chamber and configured to hold the substrate; process regions provided in the processing chamber and arranged apart from each other in a rotational direction of the rotary table; reaction gas supplying units configured to supply reaction gases of different types to the corresponding process regions; one or more separation regions provided between the process regions; one or more separation gas supplying units configured to supply a separation gas to the separation regions to separate the atmospheres of the process regions; and an exhaust path forming part having openings at positions corresponding to the process regions and configured to form exhaust paths for separately guiding the atmospheres of the process regions from the openings to the corresponding exhaust ports of the processing chamber for exhausting atmospheres of the process regions. The exhaust path forming part is configured such that positions of the openings in the rotational direction are changeable.

DESCRIPTION OF THE PREFERRED EMBODIMENTS

Preferred embodiments of the present invention are described below with reference to the accompanying drawings.

First Embodiment

Figure 1:
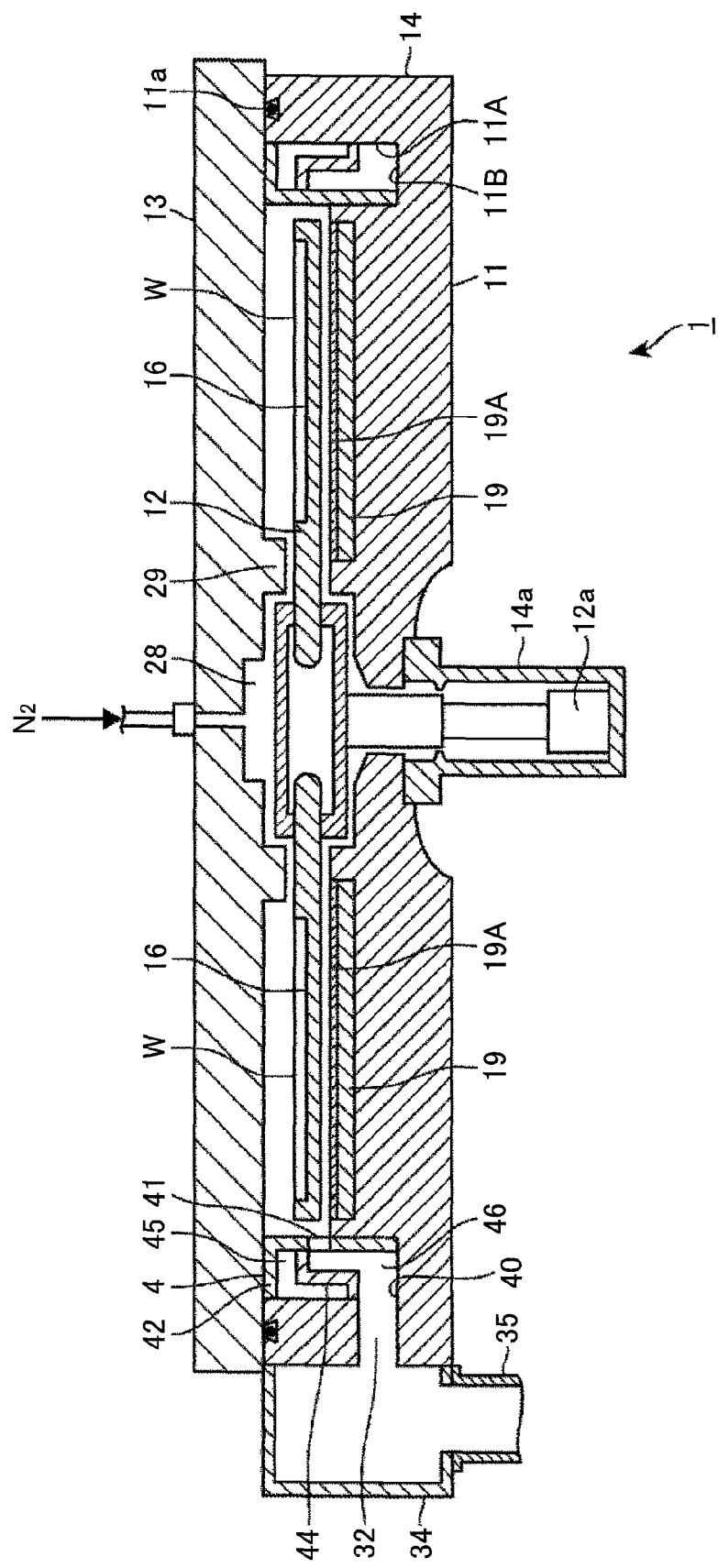
FIG. 1 is a cut-away side view of a film deposition apparatus according to a first embodiment.
Figure 2:
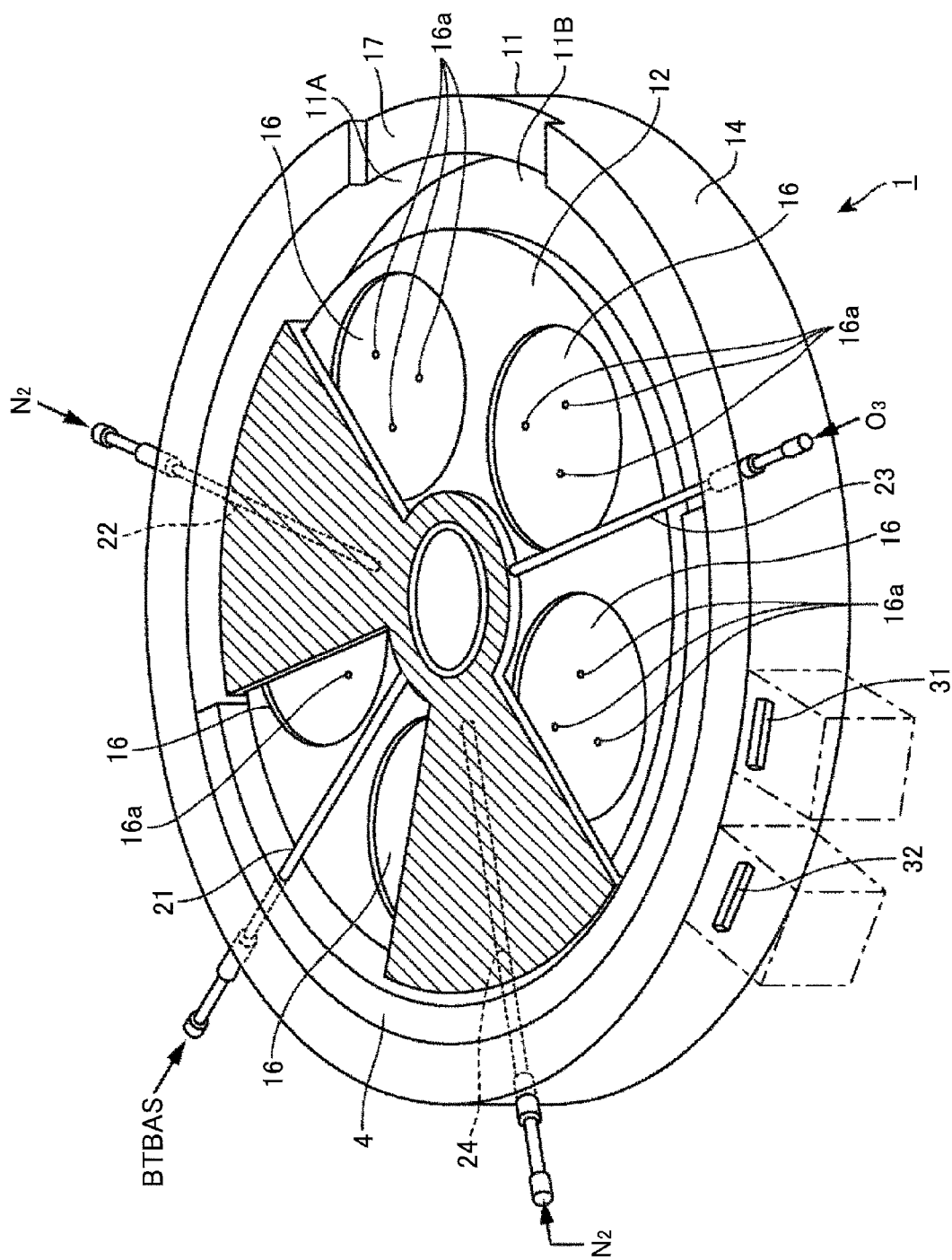
FIG. 2 is a perspective view of the film deposition apparatus of the first embodiment.
Figure 3:
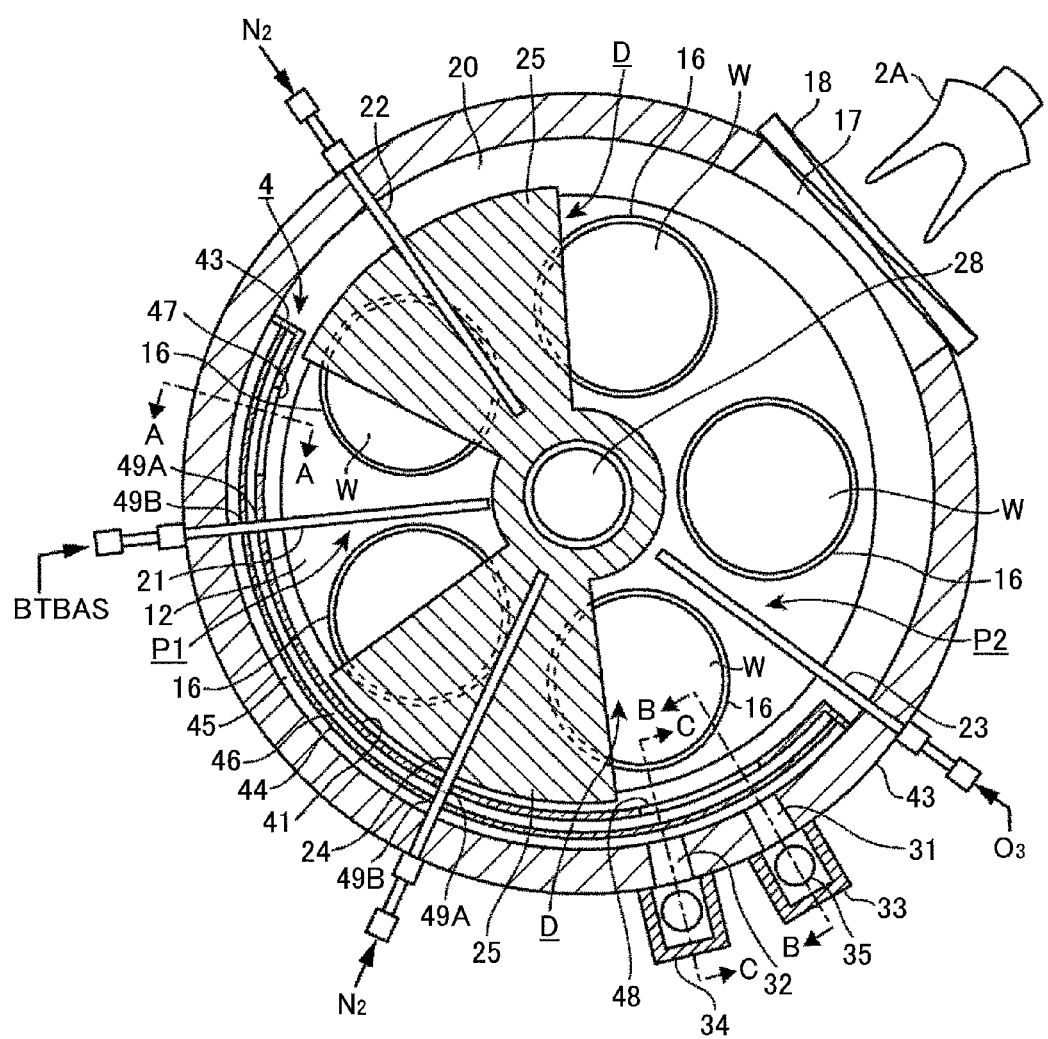
FIG. 3 is a plan view of the film deposition apparatus of the first embodiment.

A film deposition apparatus 1 according to a first embodiment is described below. The film deposition apparatus 1 performs atomic layer deposition (ALD) and molecular layer deposition (MLD) on substrates such as semiconductor wafers W (hereafter, simply referred to as "wafers W"). FIG. 1 is a cut-away side view, FIG. 2 is a perspective view, and FIG. 3 is a plan view of the film deposition apparatus 1. The film deposition apparatus 1 may include a vacuum chamber (processing chamber) 11 having a flat-circular shape and a disc-shaped rotary table 12 disposed horizontally in the vacuum chamber 11. The vacuum chamber 11 is disposed in the atmosphere, and includes a top plate 13 and a chamber body 14 that forms the side wall and the bottom of the vacuum chamber 11. In FIG. 1, 11a indicates a sealing part for keeping the vacuum chamber air tight, and 14a indicates a cover for covering a central part of the chamber body 14. A rotating mechanism 12a rotates the rotary table 12 in the circumferential direction.

Five recesses 16 are formed on a surface of the rotary table 12 along the rotational direction of the rotary table 12. In FIG. 2, 17 indicates a carry-in/out opening. As illustrated in FIG. 3, a shutter 18 is provided to open and close the carry-in/out opening 17. When a conveying mechanism 2A holding a wafer W enters the vacuum chamber 11 via the carry-in/out opening 17, elevating pins (not shown) protrude from holes 16a in the recess 16 facing the carry-in/out opening 17 to lift the wafer W above the rotary table 12, and the wafer W is passed from the conveying mechanism 2A to the recess 16. When the wafer W is carried out of the vacuum chamber 11, the elevating pins lift the wafer W in the recess 16, and the conveying mechanism 2A receives the lifted wafer W and carries the wafer W out of the vacuum chamber 11.

A first reaction gas nozzle 21, a separation gas nozzle 22, a second reaction gas nozzle 23, and a separation gas nozzle 24 are arranged in the circumferential direction on the rotary table 12 in the order mentioned. The first reaction gas nozzle 21, the separation gas nozzle 22, the second reaction gas nozzle 23, and the separation gas nozzle 24 are shaped like rods, and extend from the circumference toward the center of the rotary table 12. The gas nozzles 21 through 24 have openings facing downward to supply gases along the radius of the rotary table 12. The first reaction gas nozzle 21 discharges a bis-(tertiary butyl amino)-silane (BTBAS) gas, and the second reaction gas nozzle 23 discharges an ozone ($O_3$) gas. Meanwhile, the separation gas nozzles 22 and 24 discharge a nitrogen ($N_2$) gas.

The top plate 13 of the vacuum chamber 11 includes two fan-shaped protrusions 25 that protrude downward and are arranged at an interval in the circumferential direction. Each of the separation gas nozzles 22 and 24 is embedded in the corresponding protrusion 25 and divides the protrusion 25 in the circumferential direction. The first reaction gas nozzle 21 and the second reaction gas nozzle 23 are disposed apart from the protrusions 25.

A region below the first reaction gas nozzle 21 is referred to as a first process region P1 where a gas is supplied from the first reaction gas nozzle 21. A region below the second reaction gas nozzle 23 is referred to as a second process region P2 where a gas is supplied from the second reaction gas nozzle 23. Regions below the protrusions 25 are referred to as separation regions D. During a film deposition process, the $N_2$ gas supplied from the separation gas nozzles 22 and 24 to the separation regions D spreads in the circumferential direction in the separation regions D, thereby preventing the BTBAS gas and the $O_3$ gas from mixing with each other on the rotary table 12, and causing extra BTBAS gas and $O_3$ gas to flow into an opening of an exhaust path forming part (flow forming part) 4 described later.

Also during a film deposition process, an $N_2$ gas is supplied to a center region 28 of the rotary table 12. The top plate 13 also includes a ring-shaped protrusion 29 that protrudes downward. The $N_2$ gas supplied to the center region 28 flows under the lower end of the protrusion 29, spreads outward in the radial direction of the rotary table 12, and thereby prevents the BTBAS gas and the $O_3$ gas from mixing with each other in the center region 28. Although not shown, the $N_2$ gas is also supplied into the cover 14a and to the underside of the rotary table 12 to purge the reaction gases. A heater 19 is provided at the bottom of the vacuum chamber 11. The heater 19 heats the wafers W via the rotary table 12 to a predetermined temperature. A shield 19A is provided over the heater 19 to prevent film formation on the heater 19.

A first exhaust port 31 and a second exhaust port 32 are formed at different heights in the side wall of the vacuum chamber 11. In the present embodiment, the rotary table 12 is configured to rotate clockwise in plan view, and the exhaust ports 31 and 32 are disposed at the outer side, in the radial direction, of a region between the process region P2 and the separation region D located downstream of the process region P2 in the rotational direction. However, since positions from which gases are exhausted (or drawn) can be freely set using a flow forming part (flow path forming part) described later, the positions of the exhaust ports 31 and 32 are not limited to those illustrated in this example.

Connecting parts 33 and 34 are provided on the outer side of the vacuum chamber 11. Exhaust pipes 35 are connected via the connecting parts 33 and 34 to the corresponding exhaust ports 31 and 32. A ring-shaped recess 40 is formed on the periphery of the bottom of the vacuum chamber 11. An exhaust path forming part (flow forming part) 4 is provided between the rotary table 12 and an inner circumferential surface 11A of the side wall of the vacuum chamber 11. The exhaust path forming part 4 is shaped like a substantially half ring, and the lower side of the exhaust path forming part 4 is embedded in the recess 40. In this example, the exhaust path forming part 4 extends in the rotational direction of the rotary table 12 from a position downstream of the second process region P2 to a position downstream of the first process region P1.

Figure 4:
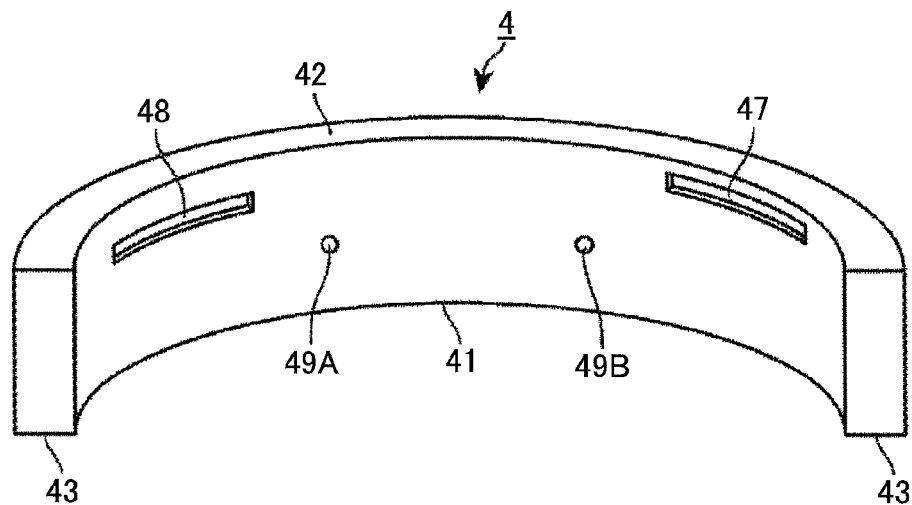
FIG. 4 is a front perspective view of a flow forming part of the film deposition apparatus of the first embodiment.
Figure 5:
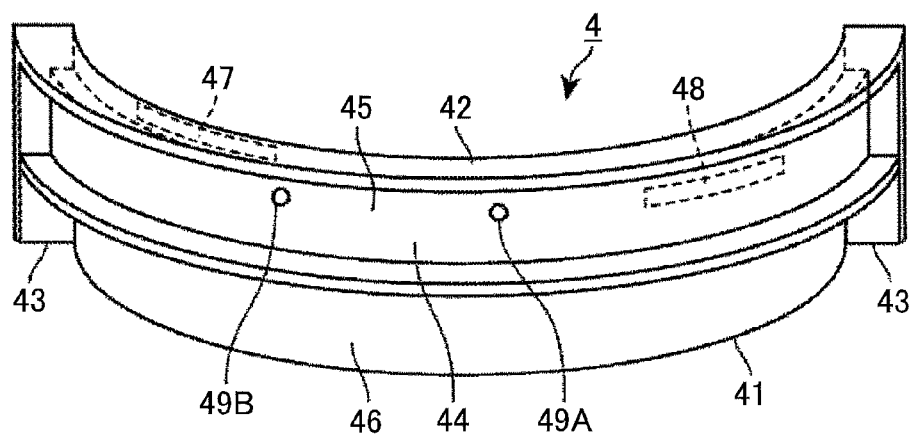
FIG. 5 is a rear perspective view of the flow forming part of the first embodiment.
Figure 6:
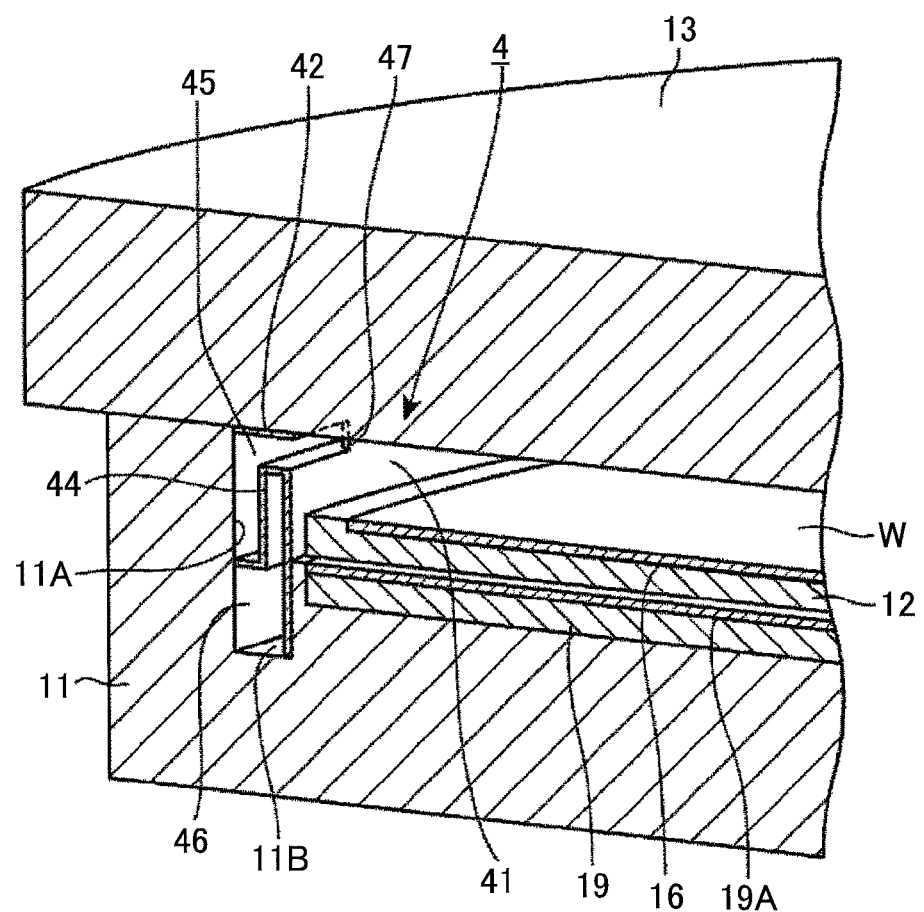
FIG. 6 is a cross-sectional view of the flow forming part of the first embodiment taken along line A-A of FIG. 3.
Figure 7:
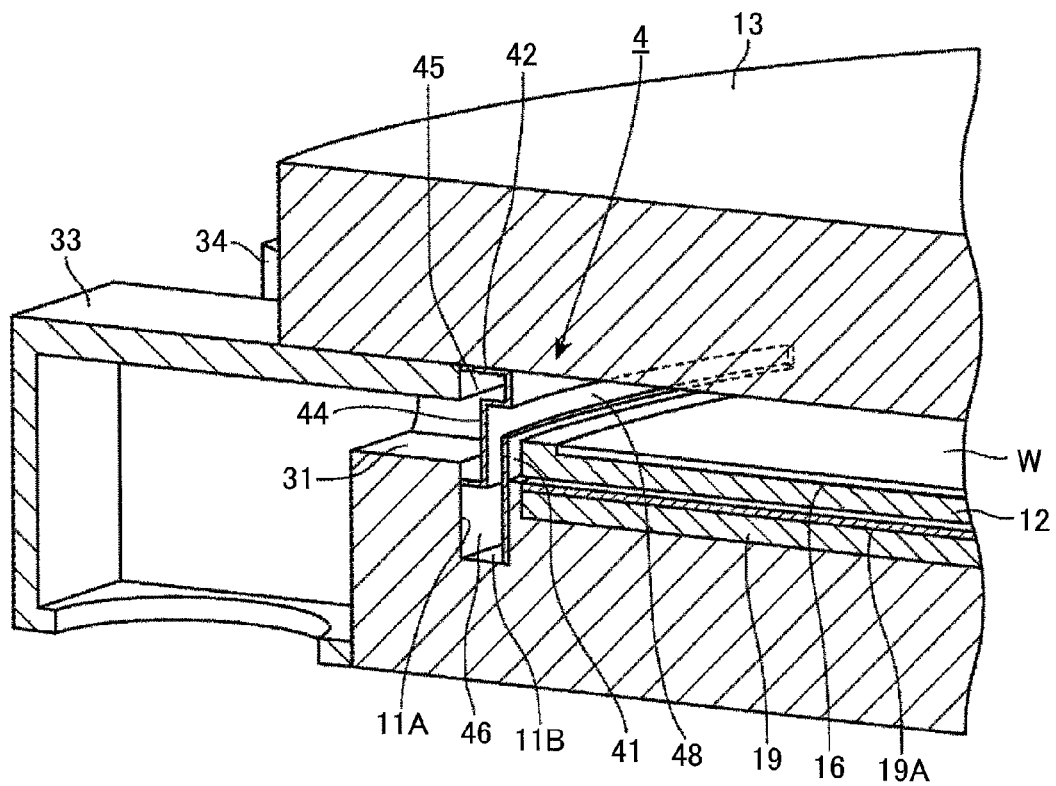
FIG. 7 is a cross-sectional view of the flow forming part of the first embodiment taken along line B-B of FIG. 3.
Figure 8:
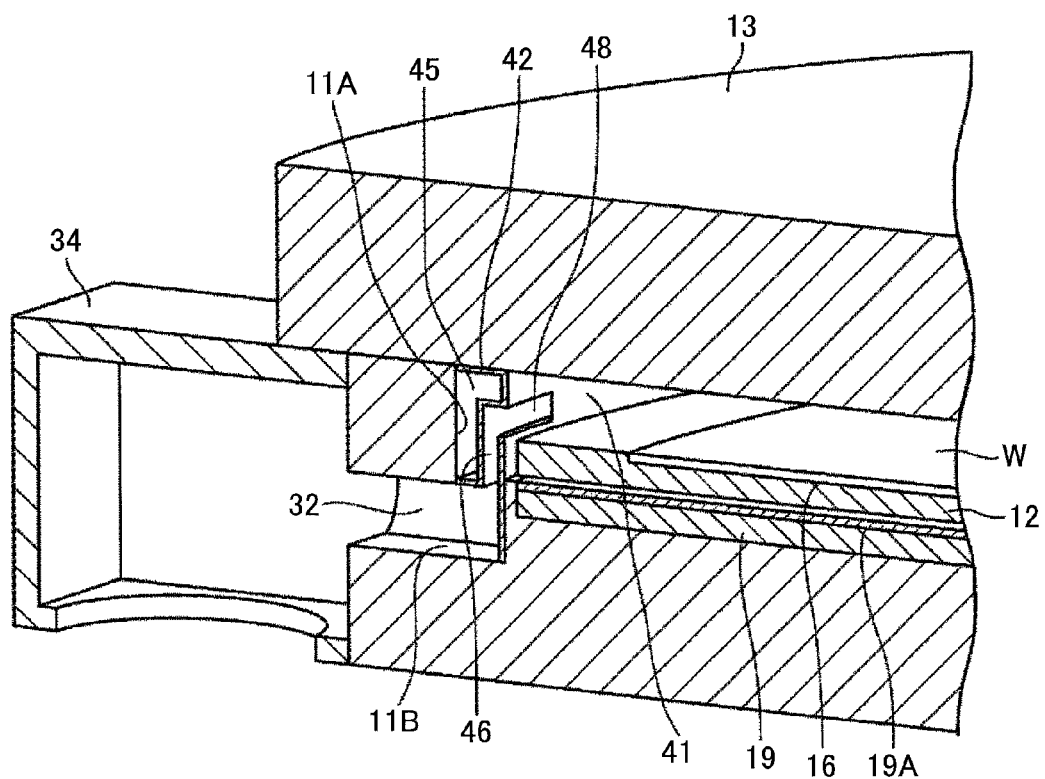
FIG. 8 is a cross-sectional view of the flow forming part of the first embodiment taken along line C-C of FIG. 3.

FIG. 4 illustrates a front side (that faces the rotary table 12) of the exhaust path forming part 4, and FIG. 5 illustrates a rear side (that faces the inner circumferential surface 11A of the vacuum chamber 11) of the exhaust path forming part 4. FIGS. 6, 7, and 8 are cross-sectional views of the exhaust path forming part 4 taken along lines A-A, B-B, and C-C of FIG. 3. The exhaust path forming part 4 is described below with reference to FIGS. 4 through 8. The exhaust path forming part 4 includes an inner plate 41, a top plate 42 disposed on the upper end of the inner plate 41, and upright plates 43 forming the ends of the exhaust path forming part 4 in the rotational direction. With this configuration, a space surrounded by the inner plate 41, the top plate 42, and the upright plates 43 is formed. In other words, the exhaust path forming part 4 is shaped like a box or a housing with openings on its rear side and bottom.

The exhaust path forming part 4 further includes a partition plate 44 that divides the space formed by the plates 41, 42, and 43 into two spaces. The partition plate 44 extends outward in the radial direction of the rotary table 12 from a position that is below the upper end of the inner plate 41, bends 90 degrees downward, and then bends 90 degrees outward in the radial direction of the rotary table 12.

Together with a bottom surface 11B of the recess 40 and the inner circumferential surface 11A of the vacuum chamber 11, the exhaust path forming part 4 forms two exhaust paths that are separated from each other by the partition plate 44. Below, the exhaust path above the partition plate 44 is referred to as a first exhaust path 45 and the exhaust path below the partition plate 44 is referred to as a second exhaust path 46. A first opening 47 connected to the first exhaust path 45 and a second opening 48 connected to the second exhaust path 46 are formed in the inner plate 41. In this example, the first opening 47 is located downstream of the first process region P1 in the rotational direction, and the second opening 48 is located upstream of the separation region D that is located upstream of the first process region P1 in the rotational direction. The positions of the openings 47 and 48 of the exhaust path forming part 4 are changeable.

For example, the positions of the openings may be changed by switching exhaust path forming parts that have openings formed at different positions in the rotational direction and are configured to be attachable to and detachable from the vacuum chamber (processing chamber) 11. As another example, an exhaust path forming part may be composed of plural components, and the positions of the openings may be changed by exchanging the positions of the components. Also, the positions of the openings may be changed by replacing a first component constituting a part of an exhaust path forming part with a second component having an opening at a position different from that of the first component. In the present embodiment, the exhaust path forming part 4 is configured to be attachable to and detachable from the vacuum chamber 11.

Through holes 49A and 49B are formed in the partition plate 44 and the inner plate 41. The gas nozzles 21 and 24 pass through the through holes 49A and 493. As illustrated in FIGS. 6, 7, and 8, the partition plate 44 separates the exhaust paths 45 and 46 such that the first exhaust path 45 is connected to (or communicates with) the first exhaust port 31 and the second exhaust path 46 is connected to (or communicates with) the second exhaust port 32. With this configuration, the atmosphere of the first process region P1 is exhausted from the first exhaust port 31 via the first opening 47 and the first exhaust path 45, and the atmosphere of the second process region P2 is exhausted from the second exhaust port 32 via the second opening 48 and the second exhaust path 46.

Next, operations of the film deposition apparatus 1 are described. The conveying mechanism 2A carries the wafers W via the carry-in/out opening 17 into the vacuum chamber 11 and sequentially places the wafers W on the recesses 16 of the rotary table 12. When the wafers W are placed on the recesses 16, vacuum pumps connected to the first exhaust port 31 and the second exhaust port 32 evacuate the vacuum chamber 11 via the first opening 47 and the second opening 48 that are connected via the exhaust path forming part 4 to the first and second exhaust ports 31 and 32. As a result, a vacuum atmosphere is created in the vacuum chamber 11. Then, the rotary table 12 is rotated, and the wafers W are heated via the rotary table 12 by the heater 19 to, for example, 350° C.

Next, gases are supplied from the gas nozzles 21 through 24. Each wafer W alternately passes through the first process region P1 below the first reaction gas nozzle 21 and the second process region P2 below the second reaction gas nozzle 23. As a result, the BTBAS gas and the $O_3$ gas are adsorbed on the wafer W in sequence, the BTBAS molecules are oxidized, and one or more molecular layers of oxide silicon are formed on the wafer W. Through the above process (film deposition process), the molecular layers of oxide silicon are stacked to form a silicon dioxide film with a predetermined thickness.

Figure 9:
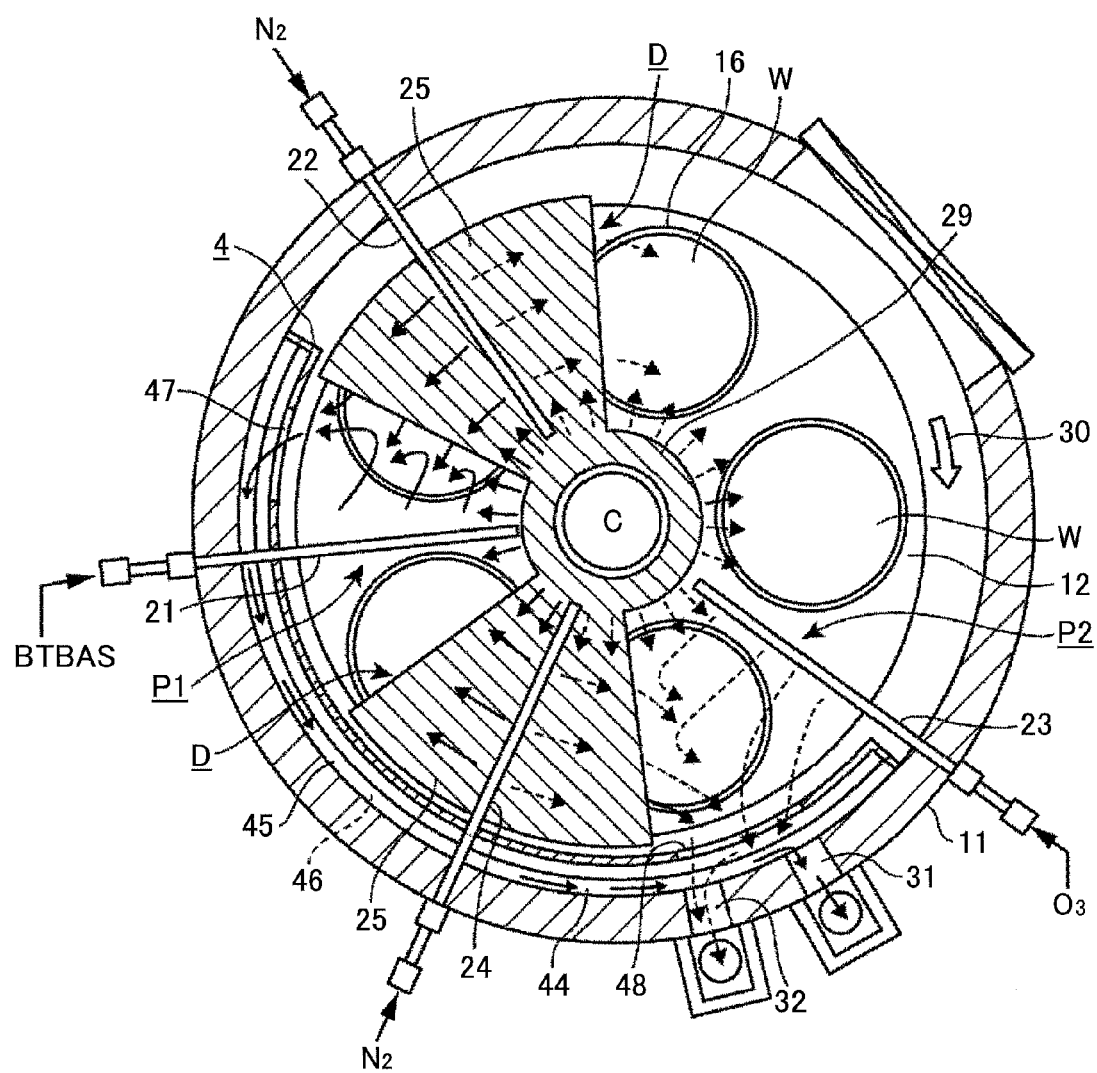
FIG. 9 is a drawing used to describe a gas flow formed in the film deposition apparatus of FIG. 1.

In FIG. 9, arrows indicate the flow of gas in the vacuum chamber 11. Solid-line arrows indicate the flow of gas exhausted from the first opening 47, and dotted-line arrows indicate the flow of gas exhausted from the second opening 48. An arrow 30 in FIG. 9 indicates the rotational direction of the rotary table 12. During the film deposition process described above, the $N_2$ gas supplied from the separation gas nozzles 22 and 24 to the separation regions D spreads in the circumferential direction in the separation regions D, and thereby prevents the BTBAS gas and the $O_3$ gas from mixing with each other on the rotary table 12. Also during the film deposition process, the $N_2$ gas is supplied to a space above the center region 28 of the rotary table 12. The $N_2$ gas supplied to the center region 28 flows under the lower end of the ring-shaped protrusion 29 of the top plate 13, spreads outward in the radial direction of the rotary table 12, and thereby prevents the BTBAS gas and the $O_3$ gas from mixing with each other in the center region 28. Although not shown, the $N_2$ gas is also supplied into the cover 14a and to the underside of the rotary table 12 to purge the reaction gases.

Since the vacuum chamber 11 is being evacuated via the first opening 47 provided in the first process region P1, extra BTBAS gas supplied to the first process region P1, the $N_2$ gas flowing from the center region 28 to the first process region P1, and the $N_2$ gas spreading from the separation regions D toward the first process region P1 flow into the first opening 47. Similarly, since the vacuum chamber 11 is being evacuated via the second opening 48 provided in the second process region P2, extra $O_3$ gas supplied to the second process region P2, the $N_2$ gas flowing from the center region 28 to the second process region P2, and the $N_2$ gas spreading from the separation regions D toward the second process region P2 flow into the second opening 48.

The gases flown into the first opening 47 are exhausted from the first exhaust port 31 via the first exhaust path 45 of the exhaust path forming part 4, and the gases flown into the second opening 48 are exhausted from the second exhaust port 32 via the second exhaust path 46 of the exhaust path forming part 4. Thus, the BTBAS gas and the O₃ gas are exhausted, respectively, via the first and second exhaust paths 45 and 46 that are separated from each other. This configuration makes it possible to prevent the gases from mixing with each other, and thereby makes it possible to prevent generation of particles. After the rotary table 12 is rotated for a predetermined number of times and a silicon dioxide film with a predetermined thickness is formed, the supply of gases is stopped and the temperature of the heater 19 is decreased. Then, the wafers W are carried out of the vacuum chamber 11 by the conveying mechanism 2A.

With the film deposition apparatus 1 described above, the atmosphere of the first process region P1 is exhausted via the first opening 47 of the exhaust path forming part 4, the first exhaust path 45 that is separated from the second exhaust path 46 for exhausting the atmosphere of the second process region P2 and formed along the rotational direction of the rotary table 12, and the first exhaust port 31 that is apart from the first opening 47 in the rotational direction of the rotary table 12. With the exhaust path forming part 4 configured as described above, it is possible to set the positions from which the atmospheres on the rotary table 12 are exhausted (or drawn), regardless of the positions of the first exhaust port 31 and the second exhaust port 32. In the first embodiment, the first exhaust port 31 is not located in the first process region P1. This configuration makes it possible to simplify the production process of the film deposition apparatus 1.

Second Embodiment

Figure 10:
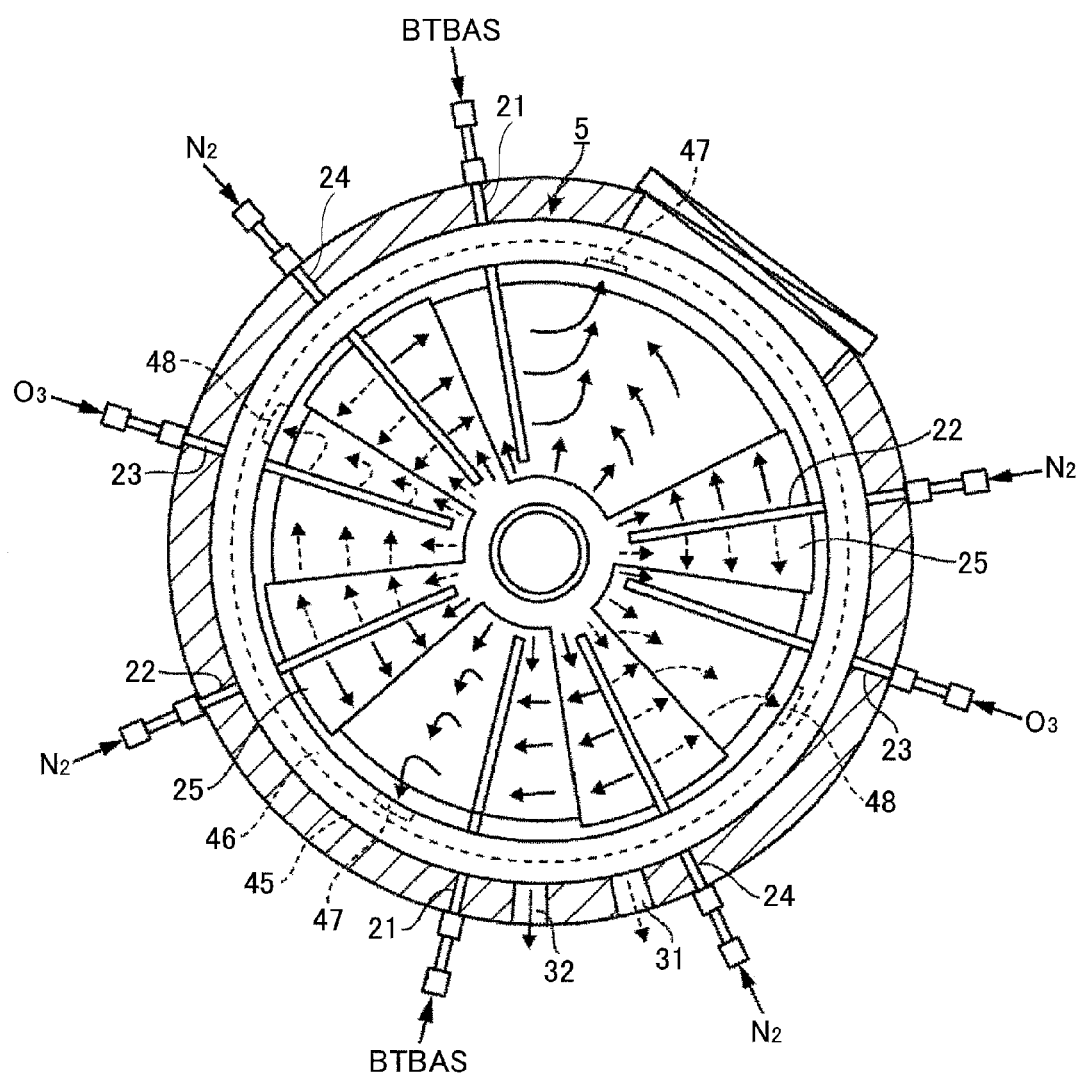
FIG. 10 is a plan view of a film deposition apparatus according to a second embodiment.

FIG. 10 is a drawing illustrating an exemplary configuration of the film deposition apparatus 1 according to a second embodiment. In the second embodiment, the film deposition apparatus 1 includes two sets of the first reaction gas nozzle 21, the separation gas nozzle 22, the second reaction gas nozzle 23, and the separation gas nozzle 24 that are arranged clockwise above the rotary table 12 in the order mentioned. With this configuration, two cycles of the adsorption of BTBAS molecules and the oxidation of the BTBAS molecules can be performed while the rotary table 12 rotates once. Separation regions D are formed by protrusions 25 between the reaction gas nozzles to prevent the mixture of the reaction gases on the rotary table 12. In FIG. 10, the wafers W are omitted.

An exhaust path forming part 5 provided for the film deposition apparatus 1 of this embodiment is shaped like a ring surrounding the rotary table 12, and the first exhaust path 45 and the second exhaust path 46 formed by the exhaust path forming part 5 are also shaped like a ring. Two first openings 47 are provided to exhaust the atmosphere of the first process regions P1, and two second openings 48 are provided to exhaust the atmosphere of the second process regions P2. Except for the above differences, the exhaust path forming part has a configuration similar to that of the exhaust path forming part 4. The first openings 47 are connected to the first exhaust path 45, and the second openings 48 are connected to the second exhaust path 46. As indicated by arrows in FIG. 10, the BTBAS gas and the N₂ gas suctioned via the first openings 47 and the O₃ gas and the N₂ gas suctioned via the second openings 48, respectively, flow through the first exhaust path 45 and the second exhaust path 46 without mixing each other, and are exhausted from the first and second exhaust ports 31 and 32.

Positions (may be referred to as "exhaust positions") in the vacuum chamber 11 from which the gases are exhausted (or drawn) to the exhaust ports 31 and 32 are determined by the positions of the first and second openings 47 and 48 of the exhaust path forming part. Therefore, when the number and positions of the separation regions D and the process regions P are changed, for example, from those of the first embodiment to those of the second embodiment, the number and positions of the openings 47 and 48 can be changed by replacing the exhaust path forming part 4 with the exhaust path forming part 5, and it is not necessary to change the number and positions of the first and second exhaust ports 31 and 32. This configuration makes it easier to change the configuration of a film deposition apparatus.

Third Embodiment

Figure 11:
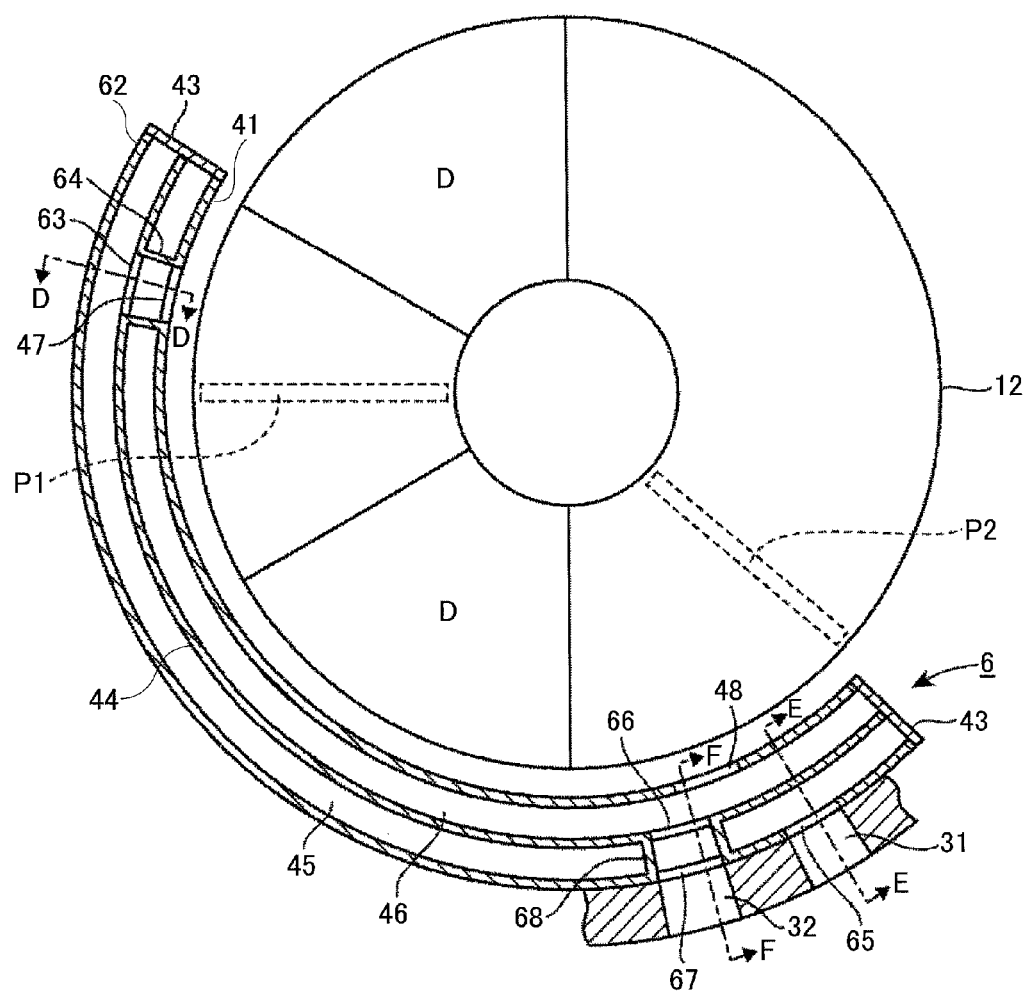
FIG. 11 is a drawing illustrating a flow forming part according to a third embodiment.
Figure 12:
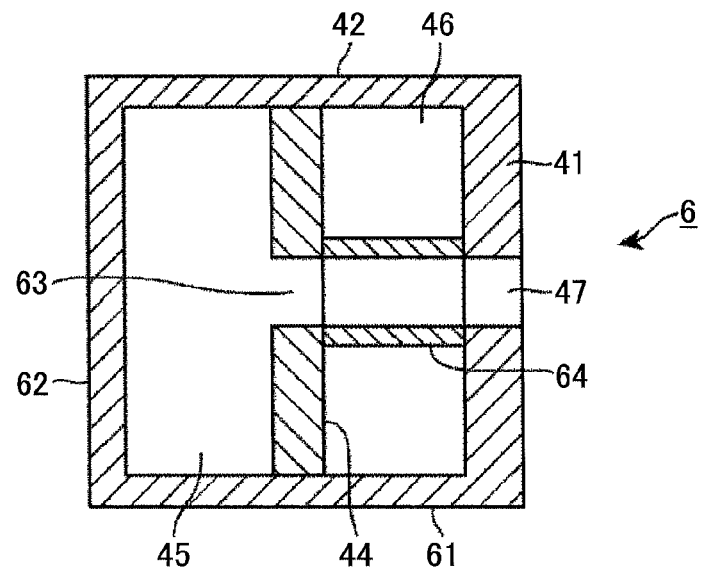
FIG. 12 is a cross-sectional view of the flow forming part of the third embodiment taken along line D-D of FIG. 11.
Figure 13:
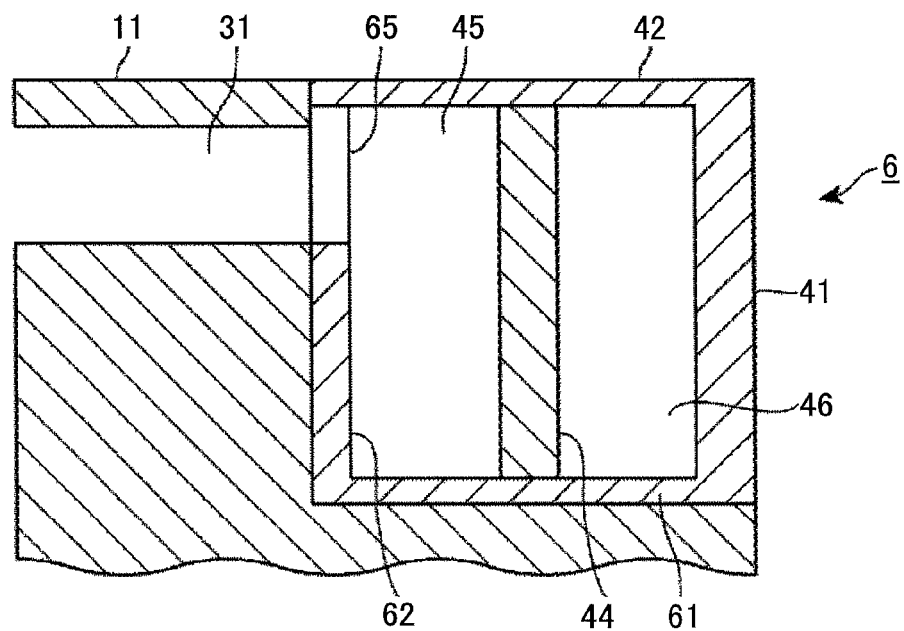
FIG. 13 is a cross-sectional view of the flow forming part of the third embodiment taken along line E-E of FIG. 11.
Figure 14:
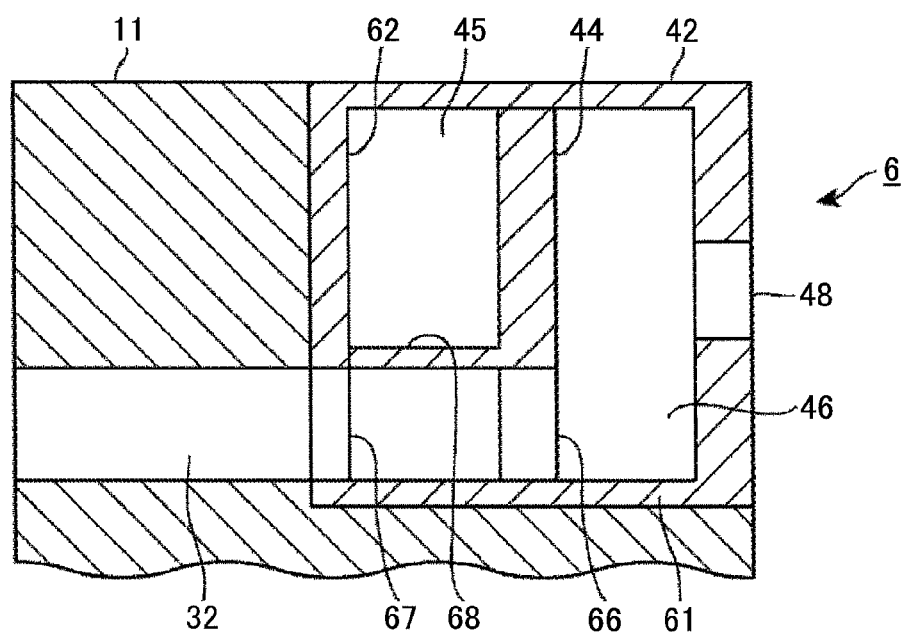
FIG. 14 is a cross-sectional view of the flow forming part of the third embodiment taken along line F-F of FIG. 11.

FIG. 11 illustrates an exhaust path forming part 6 of a third embodiment. The exhaust path forming part 6 forms exhaust paths without using the inner circumferential surface 11A of the vacuum chamber 11 and the bottom surface 11B of the recess 40 of the vacuum chamber 11. The exhaust path forming part 6 is shaped like a box formed by an inner plate 41, a top plate 42, upright plates 43, a bottom plate 61 (see FIG. 12), and an outer plate 62 that faces the inner circumferential surface 11A of the vacuum chamber 11. A space in the box is separated by a partition plate 44, which extends from the bottom to the top of the box, into a first exhaust path 45 on the outer side and a second exhaust path 46 on the inner side. FIGS. 12, 13, and 14 are cross-sectional views of the exhaust path forming part 6 taken along lines D-D, E-E, and F-F of FIG. 11.

As illustrated in FIG. 12, an opening 63 is formed in the partition plate 44 at a position corresponding to the first opening 47 of the inner plate 41, and a tubular part 64 is provided to connect the openings 47 and 63. With this configuration, a gas entering the first opening 47 flows into the first exhaust path 45 without leaking into the second exhaust path 46. Referring to FIG. 13, an opening 65 is formed in the outer plate 62 at a position corresponding to the first exhaust port 31 so that the gas passing through the first exhaust path 45 is exhausted from the first exhaust port 31. Referring to FIG. 14, an opening 66 is formed in the partition plate 44 and an opening 67 is formed in the outer plate 62 at positions corresponding to the second exhaust port 32, and a tubular part 68 is provided to connect the openings 66 and 67. With this configuration, a gas entering the second opening 48 flows into the second exhaust path 46 without leaking into the first exhaust path 45.

Fourth Embodiment

Figure 15:
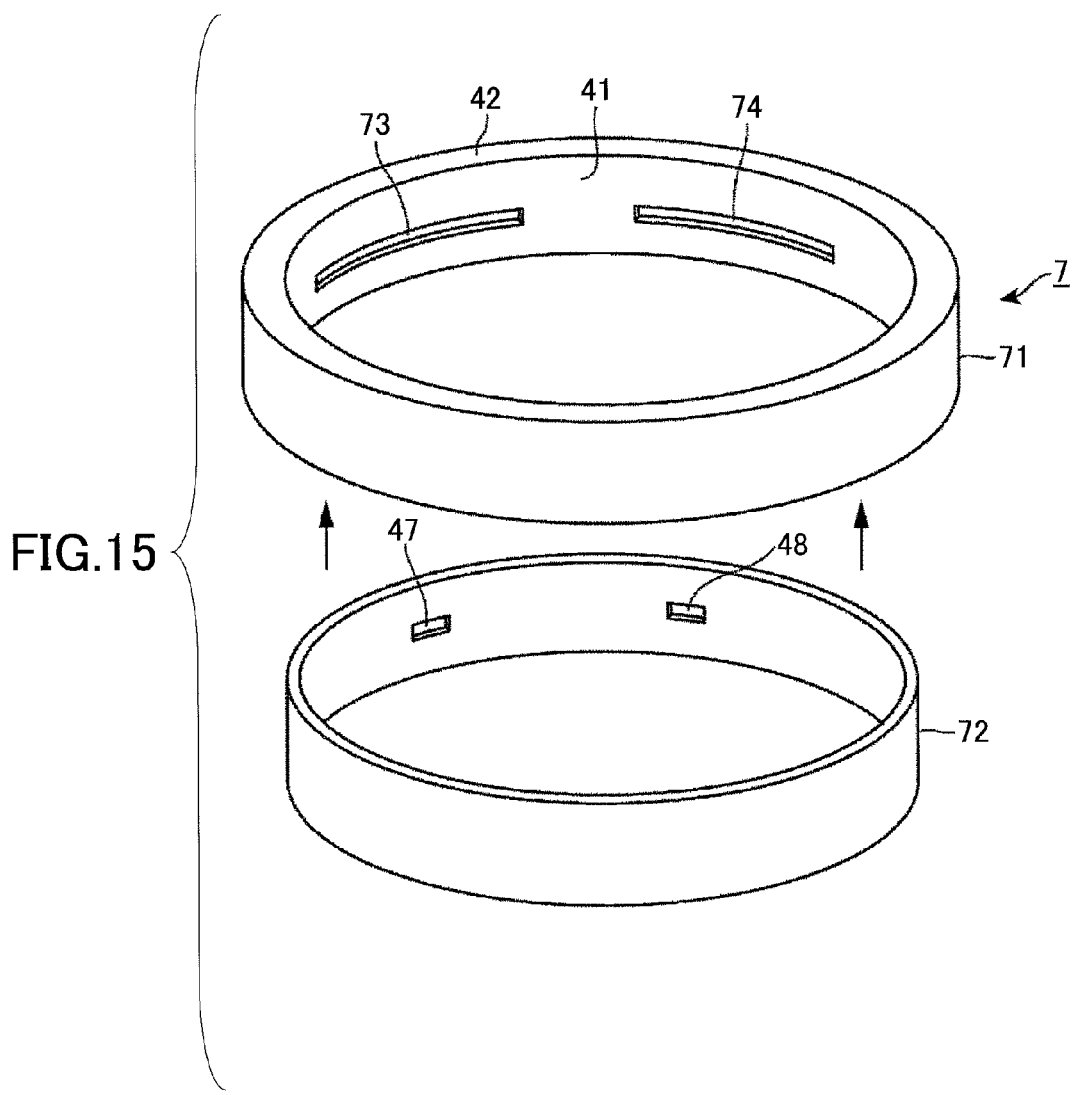
FIG. 15 is a drawing illustrating a flow forming part according to a fourth embodiment.

FIG. 15 illustrates an exhaust path forming part 7 of a fourth embodiment. The exhaust path forming part 7 includes a body 71 for forming the first and second exhaust paths 45 and 46 and a cover (opening forming part) 72 for forming openings. The body 71 and the cover 72 can be separated from each other. The body 71 has a configuration similar to that of the exhaust path forming part 6 of the third embodiment, except that the body 71 has a ring shape like the exhaust path forming part 5 of the second embodiment and horizontally-long slits 73 and 74 are formed in the inner plate 41 of the body 71. The slits 73 and 74 are connected, respectively, to the first exhaust path 45 and the second exhaust path 46. Thus, the slits 73 and correspond to the first opening 47 and the second opening 48 of the exhaust path forming part 6 except that the slits 73 and 74 are longer in the horizontal direction than the openings 47 and 48.

Figure 16:
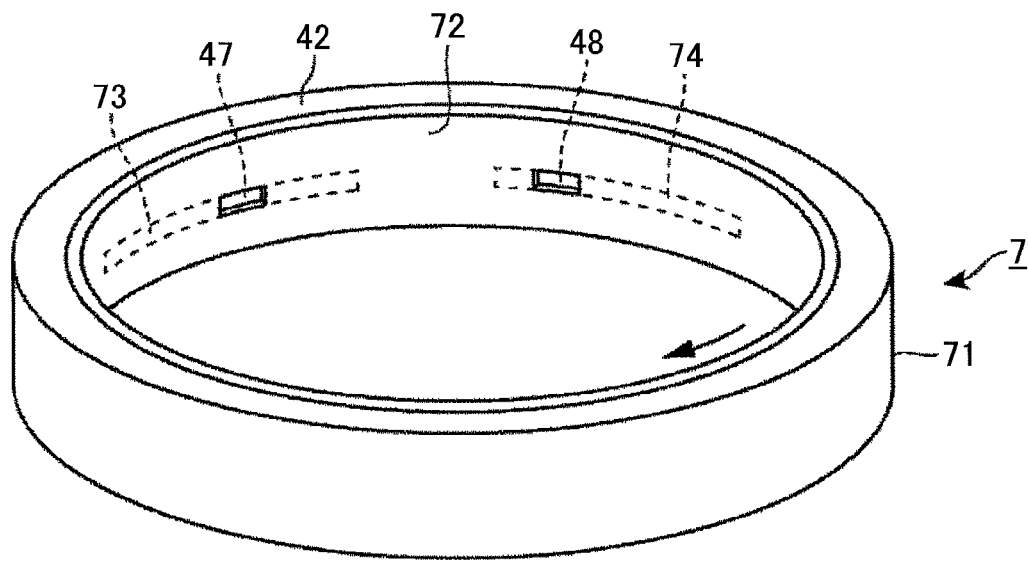
FIG. 16 is a perspective view of the flow forming part of the fourth embodiment.

The cover 72 is a ring-shaped upright plate. The cover 72 is attachable to and detachable from the body 71, and the position of the cover 72 with respect to the body 71 is changeable in the rotational direction of the rotary table 12. A first opening 47 and a second opening 48 are formed in the cover 72. As illustrated in FIG. 16, gas is exhausted from a position where the slit 73 and the first opening 47 overlap each other and from a position where the slit 73 and the second opening 48 overlap each other. Thus, positions (exhaust positions) from which gas is exhausted (or drawn) are determined by the positions of the openings 47 and 48 of the cover 72. Accordingly, exhaust positions can be changed by sliding the cover 72 in the rotational direction with respect to the body 71 and thereby moving the positions of the openings 47 and 48. Also, plural covers 72 with the openings 47 and 48 at different positions in the rotational direction may be prepared. In this case, an appropriate cover 72 may be selected and attached to the body 71 to change the positions of the openings, 47 and according to the arrangement of the separation regions D and the process regions P.

Figure 17:
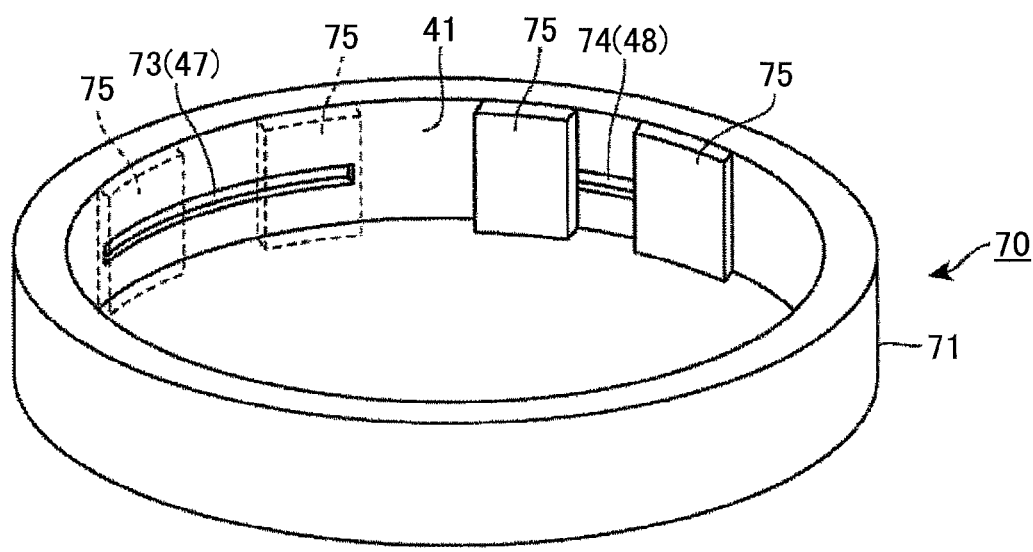
FIG. 17 is a drawing illustrating a variation of the flow forming part of the fourth embodiment.

The configuration of the fourth embodiment also eliminates the need to change the positions of exhaust ports according to the positions of process regions, and makes it easier to change the direction of an exhaust flow. The cover 72 may be used for the exhaust path forming parts of the first through third embodiments to change the exhaust positions. FIG. 17 illustrates an exhaust path forming part 70 of a variation of the fourth embodiment. The exhaust path forming part 17 includes a body 71 and covers 75. The covers 75 are attachable to and detachable from desired positions on the inner plate 41. The covers 75 are used to cover parts of the slits 73 and 74. Uncovered parts of the slits 73 and 74 are used as the first opening 47 and the second opening 48.

With the configurations of the above embodiments, it is possible to exhaust the atmospheres of process regions from openings provided in an exhaust path forming part. The positions of exhaust ports (31, 32) are not limited to those described in the above embodiments. For example, exhaust ports may be provided at the outer side, in the radial direction, of a process region or a separation region, or may be provided at the bottom of the vacuum chamber 11. Instead of discharging film deposition gases (or reaction gases) downward from gas nozzles as in the above embodiments, film deposition gases may be discharged in the radial direction from the rotation center of the rotary table 12. In the above embodiments, an exhaust path forming part is used for a film deposition apparatus where film deposition gases are supplied to first and second process regions. Alternatively, an exhaust path forming part of any one of the above embodiments may be applied to a film deposition apparatus where a reaction gas is supplied to a first process region to form a film on a wafer and an inactive gas is supplied to a second process region to perform annealing on the film formed on the wafer. Also, a film deposition apparatus may be configured such that a film is formed in a first process region and the film is oxidized in a second process region by supplying an oxidation gas to the second process region and converting the oxidation gas into plasma. As the plasma treatment, a nitriding treatment may be used instead of an oxidation treatment. Also, an exhaust path forming part of any one of the above embodiments may be applied to a substrate processing apparatus that processes a substrate using gases. In a substrate processing apparatus, for example, different gases may be supplied to a wafer in different process regions to etch a film formed on the wafer. Further, three or more process regions where processes are performed using different gases may be provided in a substrate processing apparatus, and the process regions may be separated by separation regions.

According to an aspect of this disclosure, an exhaust path forming part of any one of the above embodiments may be applied to a film deposition apparatus where reaction gases of different types are supplied in sequence to a substrate on a rotating rotary table to stack plural layers of a reaction product and thereby form a thin film on the substrate.

According to another aspect of this disclosure, an exhaust path forming part of any one of the above embodiments may be applied to a substrate processing apparatus where reaction gases of different types are supplied in sequence to a substrate on a rotating rotary table to process the substrate.

An aspect of this disclosure makes it possible to exhaust the atmospheres of plural process regions from the corresponding exhaust ports while preventing the atmospheres from mixing together and without changing the positions of the exhaust ports.

According to an aspect of this disclosure, an exhaust path forming part of a processing chamber includes openings at positions corresponding to plural process regions and exhaust paths that guide the atmospheres of the process regions separately from the openings to the corresponding exhaust ports. The exhaust path forming part is configured such that the positions of the openings are changeable in the rotational direction of a rotary table. This configuration makes it possible to draw reaction gases supplied to process regions from desired positions and exhaust the reaction gases from exhaust ports while preventing the reaction gases from mixing with each other. This configuration also eliminates the need to change the positions of exhaust ports when the positions of process regions and/or separation regions are changed, and thereby makes it easier to change the configuration of a film deposition apparatus.

A film deposition apparatus and a substrate processing apparatus according to the embodiments are described above. However, the present invention is not limited to the specifically disclosed embodiments, and variations and modifications may be made without departing from the scope of the present invention.

What is claimed is:

1. A film deposition apparatus for forming a film on a substrate, comprising:
   a processing chamber;
   a rotary table disposed in the processing chamber and configured to hold the substrate;
   a plurality of process regions provided in the processing chamber and arranged apart from each other in a rotational direction of the rotary table, the processing chamber having exhaust ports for exhausting atmospheres of the process regions;
   a plurality of reaction gas supplying units configured to supply reaction gases of different types to the corresponding process regions;
   one or more separation regions provided between the process regions;
   one or more separation gas supplying units configured to supply a separation gas to the separation regions to separate the atmospheres of the process regions; and
   an exhaust path forming part having openings at positions corresponding to the process regions and configured to form exhaust paths for separately guiding the atmospheres of the process regions from the openings to the corresponding exhaust ports,
   wherein the exhaust path forming part is configured such that positions of the openings in the rotational direction are changeable.

2. The film deposition apparatus as claimed in claim 1, wherein
   the openings of the exhaust path forming part includes a first opening and a second opening;

the exhaust paths includes a first exhaust path connected to the first opening and a second exhaust path connected to the second opening; and the first exhaust path and the second exhaust path extend in the rotational direction of the rotary table in parallel with each other.

3. The film deposition apparatus as claimed in claim 1, wherein the exhaust path forming part is attachable to and detachable from the processing chamber.

4. The film deposition apparatus as claimed in claim 3, wherein the exhaust path forming part is replaceable with another exhaust path forming part having openings at positions that are different from the positions of the openings of the exhaust path forming part in the rotational direction.

5. The film deposition apparatus as claimed in claim 1, wherein the exhaust path forming part includes
a body configured to form the exhaust paths, and
an opening forming part configured to form the openings; and
a position of the opening forming part with respect to the body is changeable in the rotational direction.

6. The film deposition apparatus as claimed in claim 1, wherein exhaust positions in the processing chamber from which the atmospheres of the process regions are exhausted to the exhaust ports are changeable by changing the positions of the openings of the exhaust path forming part.

7. A substrate processing apparatus for processing a substrate, comprising:

a processing chamber;

a rotary table disposed in the processing chamber and configured to hold the substrate;

a plurality of process regions provided in the processing chamber and arranged apart from each other in a rotational direction of the rotary table, the processing chamber having exhaust ports for exhausting atmospheres of the process regions;

a plurality of reaction gas supplying units configured to supply reaction gases of different types to the corresponding process regions;

one or more separation regions provided between the process regions;

one or more separation gas supplying units configured to supply a separation gas to the separation regions to separate the atmospheres of the process regions; and an exhaust path forming part having openings at positions corresponding to the process regions and configured to form exhaust paths for separately guiding the atmospheres of the process regions from the openings to the corresponding exhaust ports, wherein the exhaust path forming part is configured such that positions of the openings in the rotational direction are changeable.

* * * * *